(12) United States Patent
Kajiwara

(10) Patent No.: US 8,309,469 B2
(45) Date of Patent: Nov. 13, 2012

(54) METHOD OF FABRICATING SEMICONDUCTOR DEVICE

(75) Inventor: Seiji Kajiwara, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/372,191

(22) Filed: Feb. 17, 2009

(65) Prior Publication Data

US 2009/0298274 A1 Dec. 3, 2009

(30) Foreign Application Priority Data

May 29, 2008 (JP) ................................. 2008-140869

(51) Int. Cl.
*H01L 21/461* (2006.01)
(52) U.S. Cl. ................ 438/717; 438/763; 257/E21.026; 257/E21.214
(58) Field of Classification Search .............. 438/67, 438/671, 700, 702, 703, 704, 705, 717, 718, 438/719, 720, 723, 724, 725, 734, 735, 736, 438/737, 738, 763, 740, 947; 257/E21.035, 257/E21.038, E21.026, E21.027, E21.214
See application file for complete search history.

(56) References Cited

U.S. PATENT DOCUMENTS

| | | | | |
|---|---|---|---|---|
| 6,429,123 B1 * | 8/2002 | Tseng | ............................ | 438/642 |
| 6,638,441 B2 | 10/2003 | Chang et al. | | |
| 7,291,560 B2 | 11/2007 | Parascandola et al. | | |
| 7,312,158 B2 * | 12/2007 | Miyagawa et al. | ............ | 438/737 |
| 7,531,456 B2 * | 5/2009 | Kwon et al. | ................... | 438/671 |
| 7,732,341 B2 * | 6/2010 | Koh et al. | ...................... | 438/717 |
| 2004/0180484 A1 * | 9/2004 | Furukawa et al. | ............ | 438/197 |
| 2005/0221513 A1 * | 10/2005 | Yue et al. | ........................ | 438/14 |
| 2006/0046200 A1 | 3/2006 | Abatchev et al. | | |
| 2006/0240361 A1 * | 10/2006 | Lee et al. | ...................... | 430/313 |

(Continued)

FOREIGN PATENT DOCUMENTS

JP 9-232427 9/1997

(Continued)

OTHER PUBLICATIONS

Notification of Submission of Argument issued by the Korean Patent Office on Feb. 22, 2011, for Korean Patent Application No. 10-2009-47018, and English-language translation thereof.

(Continued)

*Primary Examiner* — William D Coleman
*Assistant Examiner* — Su Kim
(74) *Attorney, Agent, or Firm* — Finnegan, Henderson, Farabow, Garrett & Dunner, L.L.P.

(57) ABSTRACT

A method of fabricating a semiconductor device includes forming core material patterns comprising first films separated from another above a substrate; modifying surfaces of core material patterns so a second film is formed, selectively etchable, with first films internally remaining, the second film not covering a base layer of core material patterns between core material patterns; covering an upper surface and sides of the second film and forming a third film on the substrate; etching back the third film to expose an upper surface of the second film and the base layer of core material patterns between the patterns, causing the third film to selectively remain; removing the second film more rapidly than the first and third films; and patterning the base layer with the first and third films remaining on the base layer serving as a mask after the second film has been removed, forming a base layer pattern.

20 Claims, 21 Drawing Sheets

U.S. PATENT DOCUMENTS

2008/0008969 A1 1/2008 Zhou et al.
2008/0090418 A1 4/2008 Jeon et al.

FOREIGN PATENT DOCUMENTS

| JP | 2004-14652 | 1/2004 |
| JP | 2008-91925 | 4/2008 |
| KR | 10-2006-0110706 | 10/2006 |
| WO | WO 2008/008338 A2 | 1/2008 |

OTHER PUBLICATIONS

Notification of Reasons for Refusal issued by the Japanese Patent Office on Feb. 28, 2012, for Japanese Patent Application No. 2008-140869, and English-language translation thereof.

* cited by examiner

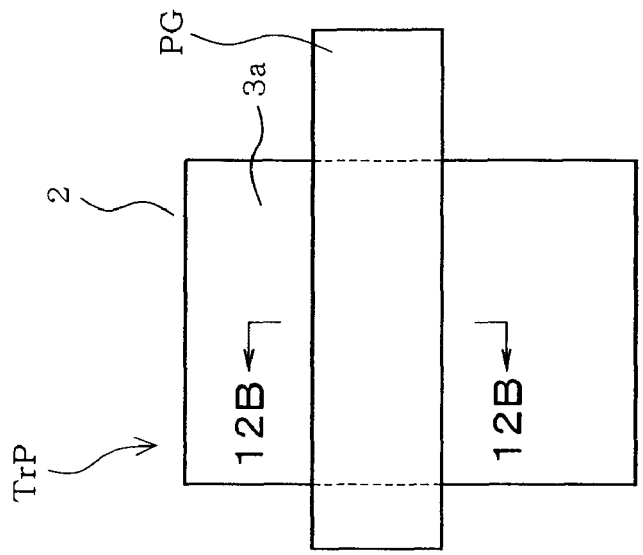
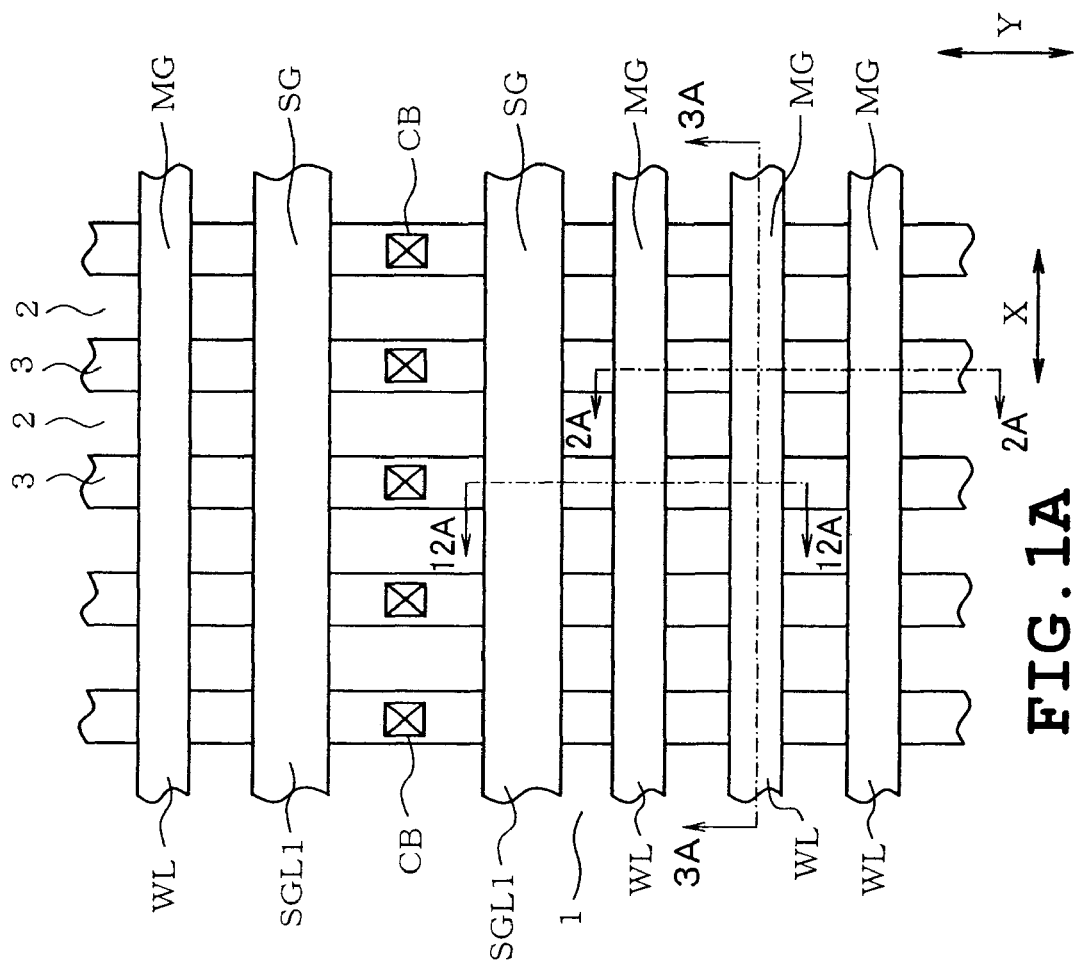
FIG. 1B
FIG. 1A

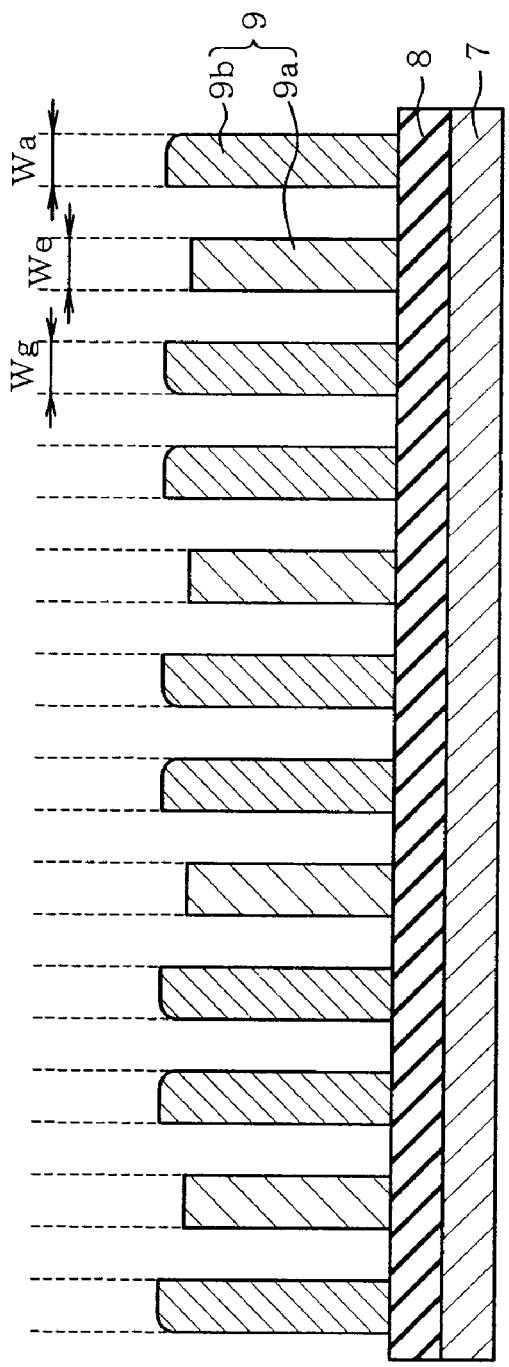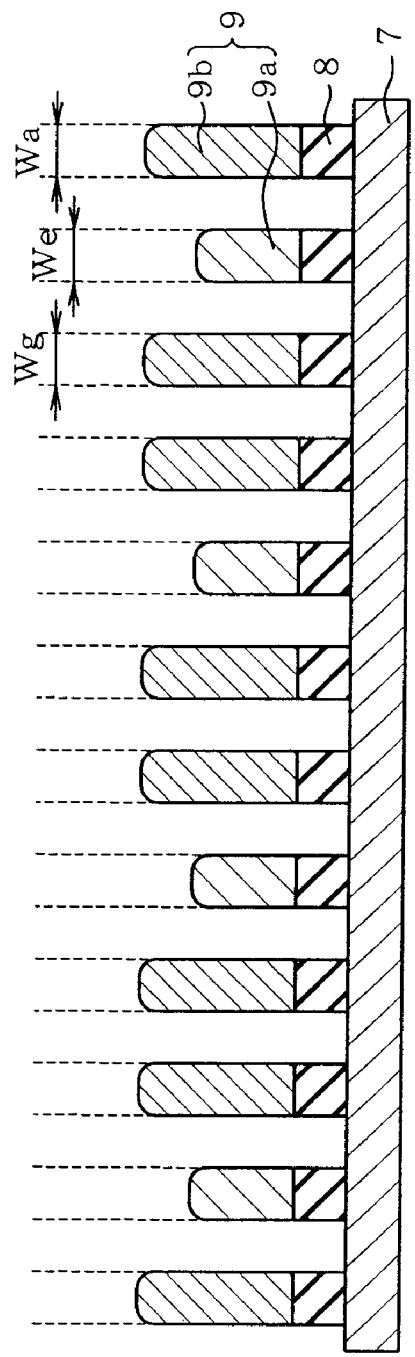
FIG. 10
FIG. 11

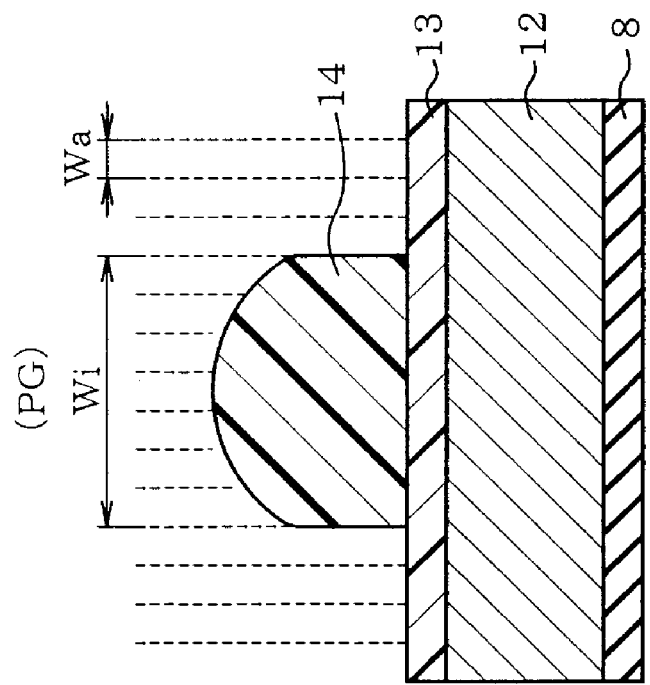
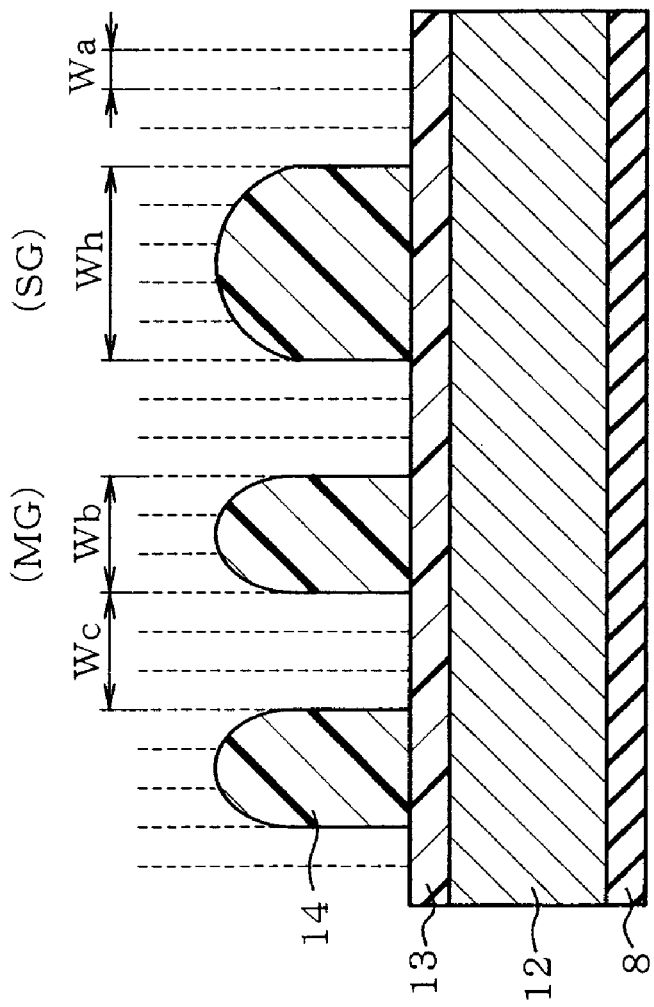
FIG. 12A
FIG. 12B

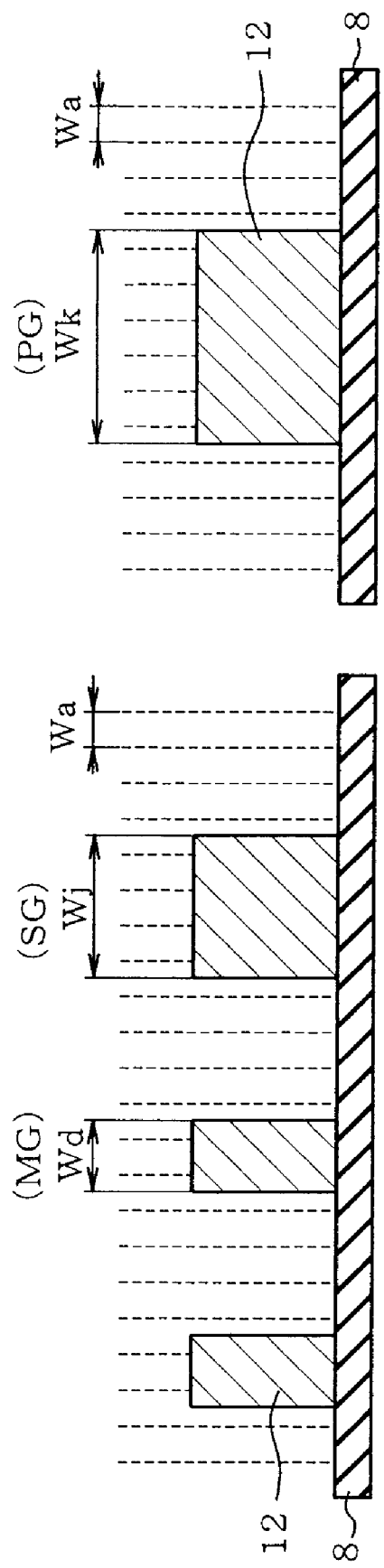

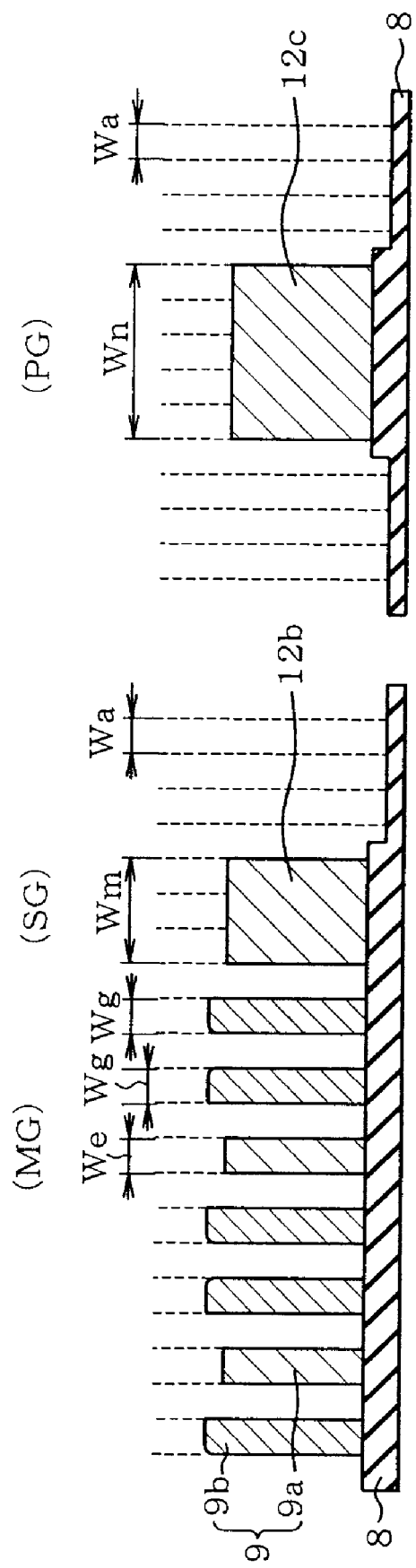

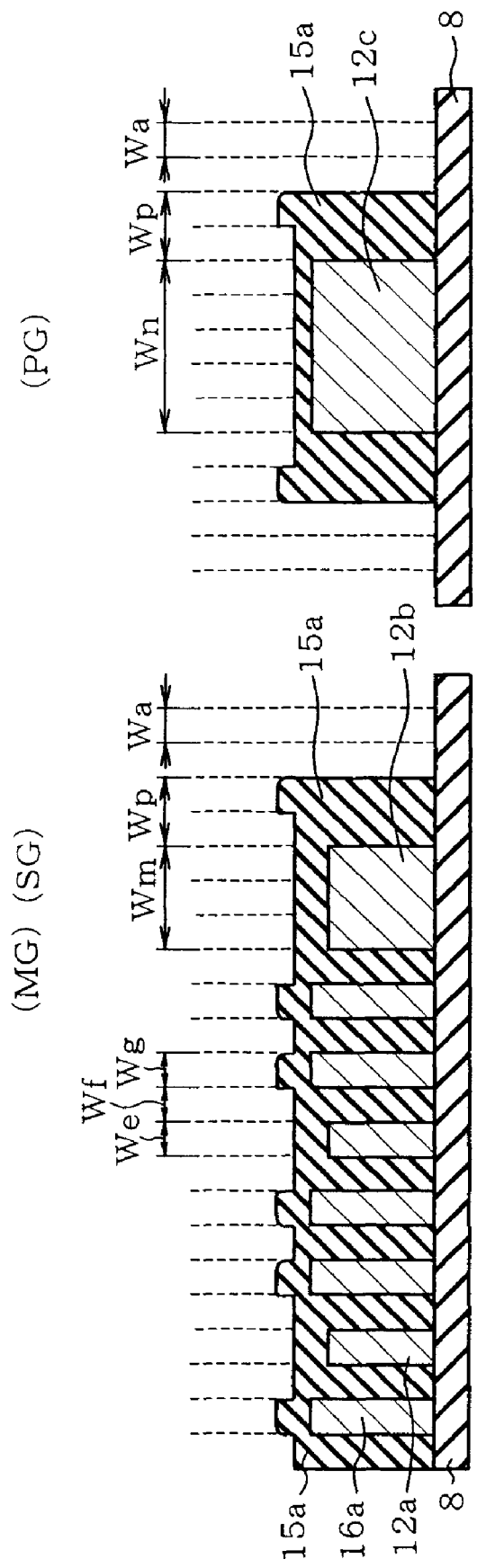

US 8,309,469 B2

METHOD OF FABRICATING SEMICONDUCTOR DEVICE

CROSS-REFERENCE TO RELATED APPLICATIONS

This application is based on and claims the benefit of priority from the prior Japanese Patent Application No. 2008-140869, filed on May 29, 2008, the entire contents of which are incorporated herein by reference.

BACKGROUND

1. Field of the Invention

The present invention relates to a method of fabricating a semiconductor device, in which a microscopic line and space pattern is formed.

2. Description of the Related Art

A line-and-space wiring pattern is well known and includes a plurality of lines each of which has a predetermined width and which are arranged with a predetermined space or interval. The following two methods are available for forming the line-and-space wiring pattern. In one method, a wiring material film is patterned, whereas, in the other method, a trench is formed in an insulating film further formed on a semiconductor substrate and is filled with a wiring pattern material. In the former method, a film to be processed which is a conductive film is patterned into a wiring pattern using a mask having the same pitch as the line-and-space. In the latter, a film to be processed which is an insulating film is patterned using a mask with the same pitch as the line-and-space, so that a trench is formed. The trench is filled with a wiring material and thereafter, an upper surface of the semiconductor substrate is polished by a chemical mechanical polishing (CMP) method, whereupon a wiring pattern is formed.

An optically readable mask pattern is used in an exposure technique of the photolithography both in the above-described two methods. Accordingly, whether a desired pitch of the line-and-space pattern can be obtained depends upon the precision of the exposure technique. However, microfabrication has recently been progressing at an accelerating pace in the semiconductor fabrication technique. Under these circumstances, the line-and-space pattern is required to have a pitch of not more than a limit of the exposure technique.

U.S. Pat. No. 6,638,441 proposes a semiconductor fabricating method in which a line-and-space pattern with a pitch equal to one third of an original pitch is formed by use of the photolithography technique. The disclosed fabricating method includes the following steps. Firstly, a photoresist layer formed on a semiconductor substrate is patterned and thereafter, a first layer is formed on the photoresist layer. The first layer is etched back so that the substrate is exposed. Subsequently, a second layer is formed on the substrate including the upper surface of the first layer. The second layer is etched back so that the photoresist layer and the first layer are exposed. Thereafter, the photoresist layer is removed. A third layer is then formed on the substrate including the upper surface of the first layer. The third layer is etched back so that the substrate is exposed. Subsequently, a fourth layer is formed on the first layer and then etched back so that the first layer is exposed. Thereafter, the second and third layers are removed.

However, the above-described fabricating method necessitates a large number of steps and accordingly a long fabricating time. As a result, the yield is reduced and the fabricating cost is increased.

BRIEF SUMMARY

An aspect of the present invention provides a method of fabricating a semiconductor device, comprising steps of: a first step of forming a plurality of core material patterns which are separated from each other above a substrate and comprise a first film; a second step of modifying surfaces of the core material patterns to form a second film which is selectively etchable with the first film internally remaining and which includes portions separated from each other above the substrate, the second film not covering a base layer of the core material patterns between the core material patterns; a subsequent step of forming a third film to cover upper surfaces and side surfaces of the portions of the second film and an upper surface of the substrate; a third step of etching back the third film to expose the upper surfaces of the portions of the second film and to expose the base layer of the core material patterns between the core material patterns, and causing the third film to selectively remain, the third film being formed on sidewalls of the core material patterns with the second film being interposed therebetween; a fourth step of selectively removing the second film with the first and third films remaining; and a fifth step of patterning the base layer with the first and third films both on the base layer serving as a mask after the second film has been removed, thereby forming a base layer pattern.

BRIEF DESCRIPTION OF THE DRAWINGS

In the accompanying drawings,

FIGS. 1A and 1B are schematic plan views showing a layout pattern of transistors in a part of a memory cell region and a peripheral circuit region of a NAND flash memory of an embodiment;

FIGS. 4 to 11 are sectional views showing a step of forming a mask pattern (Nos. 1 to 8);

FIGS. 12A and 12B are sectional views showing the mask pattern forming step in a method of a second embodiment, the views being taken along line 12A-12A in FIG. 1A and line 12B-12B in FIG. 1B respectively (NO.1);

FIGS. 13 to 21 are sectional views showing the mask pattern forming step (Nos. 2 to 10);

FIGS. 23 to 25 are sectional views showing the mask pattern forming step (Nos. 2 to 4).

DETAILED DESCRIPTION

Figure 2A:
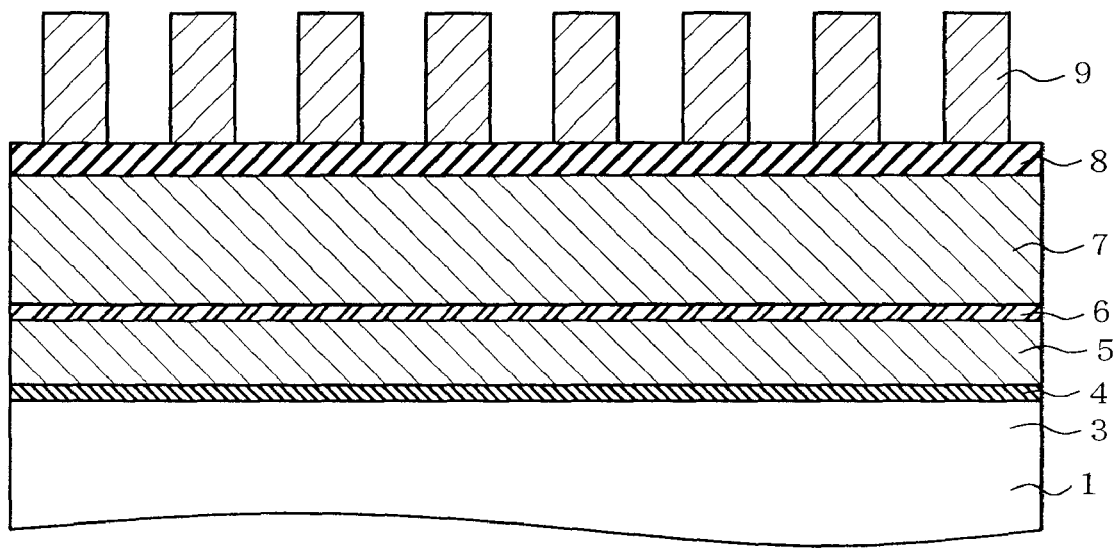
FIGS. 2A and 2B are schematic sectional views taken along line 2A-2A in FIG. 1A, showing a step of forming gate electrodes.

A first embodiment will be described with reference to FIGS. 1A to 11. The invention is applied to a fabrication process of a NAND flash memory in the embodiment. In the following description, identical or similar parts are labeled by the same reference numerals throughout the embodiments. The drawings are typical illustrations, and the relationship between a thickness and plane dimension, layer thickness ratio and the like differ from natural size. The NAND flash memory includes a memory cell region in which a number of memory cell transistors are arranged in a matrix and a peripheral circuit region in which peripheral circuit transistors are provided for driving the memory cell transistors.

FIG. 1A shows a layout pattern of a part of a memory cell region, and FIG. 1B shows a transistor in a peripheral circuit region. A silicon substrate 1 serving as a semiconductor substrate has a plurality of trenches 2 with a shallow trench isolation (STI) structure as shown in FIG. 1A. The trenches 2 are formed in the Y-direction at predetermined intervals as viewed in FIG. 1. As a result, active regions 3 are formed so as to be separated from one another in the X-direction as viewed in FIG. 1A. Word lines WL of the memory cell transistors are formed at predetermined intervals so as to extend in the X-direction perpendicular to the active regions 3. Furthermore, a pair of selective gate lines SGL1 of selective gate transistors are formed so as to extend in the X-direction. Plural bit line contacts BL are formed in portions of the active regions 3 located between the selective gate lines SGL1 respectively. Gate electrodes MG of the memory cell transistors are formed on portions of the active regions 3 intersecting the word lines WL respectively. Gate electrodes SG (selective gate electrodes) of the selective gate transistors are formed on portions of the active regions 3 intersecting the selective gate lines SGL1 respectively.

Referring now to FIG. 1B, a transistor TrP to be formed in the peripheral circuit region is provided in a part in which the STI structure 2 is formed so that a rectangular active area 3a remains. An isolated gate electrode PG is formed so as to cross the active region 3a. Source/drain regions are provided at both sides of the isolated gate electrode PG. The source/drain regions are formed by diffusing impurities into both sides of the electrode PG.

Figure 2B:
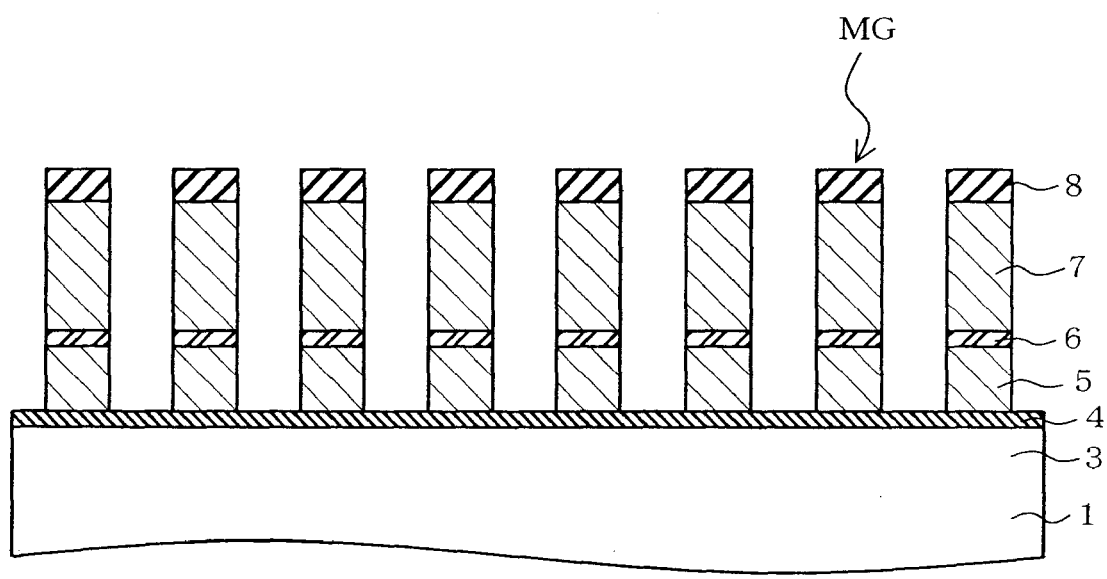

A fabrication process which is a first objective in the embodiment will now be described with reference to FIGS. 2A to 11. FIGS. 2A and 2B are schematic sectional views showing unprocessed and processed states respectively in the case where the gate electrodes serving as the word lines WL are collectively formed. The sections as shown in FIGS. 2A and 2B are taken along line 2A-2A in FIG. 1A. A gate insulating film 4 is formed on an upper surface of the silicon substrate 1 as shown in FIG. 2A. Films constituting the gate electrode MG are sequentially formed on an upper surface of the gate insulating film 4. These films constituting the gate electrode MG include a polycrystalline silicon film 5, an intergate insulating film 6, a polycrystalline silicon film 7 and a silicon nitride film 8. The films 5 to 7 constituting the gate electrode MG are formed with the silicon nitride film 8 serving as a mask film. A shrunk pattern 9 comprising an amorphous silicon film is formed on an upper surface of the silicon nitride film 8. The silicon nitride film 8 serving as a base layer is etched and then patterned. Thereafter, the shrunk pattern 9 is removed, and the polycrystalline silicon film 7, the intergate insulating film 6 and the polycrystalline silicon film 5 constituting the gate electrode MG are processed sequentially in this order, whereupon the configuration as shown in FIG. 2B is obtained.

A step of forming the shrunk pattern 9 is carried out prior to the above-described step of forming the gate electrode MG. The shrunk pattern 9 has a pattern width (a line dimension) of about 15 nm and an interval (a space dimension) of about 15 nm that is a distance between adjacent lines. In other words, a line and space has a dimension of about 15 nm. The step of forming the microscopic shrunk pattern 9 is carried out in order that a patterning dimension in the photolithography process may be reduced to a pitch that is about one third of the patterning dimension, as will be described later.

Figure 3A:
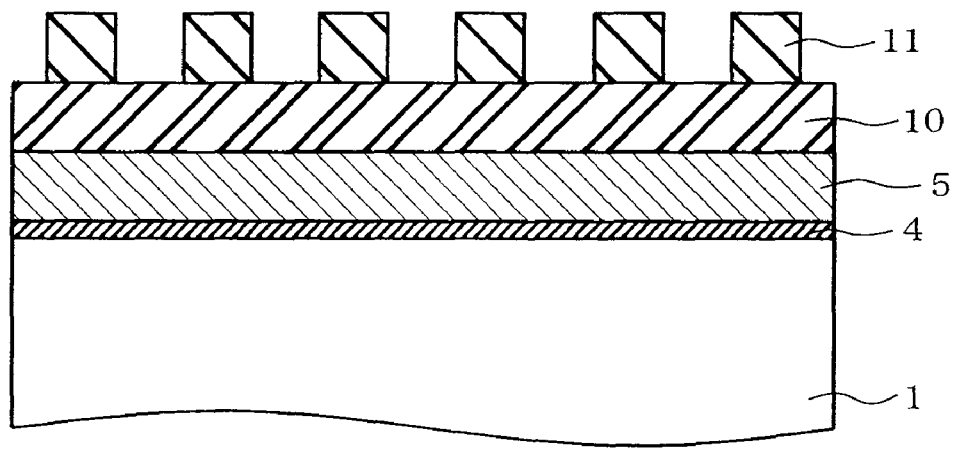
FIGS. 3A and 3B are schematic sectional views taken along line 3A-3A in FIG. 1A, showing a step of forming a trench for STI.
Figure 3B:
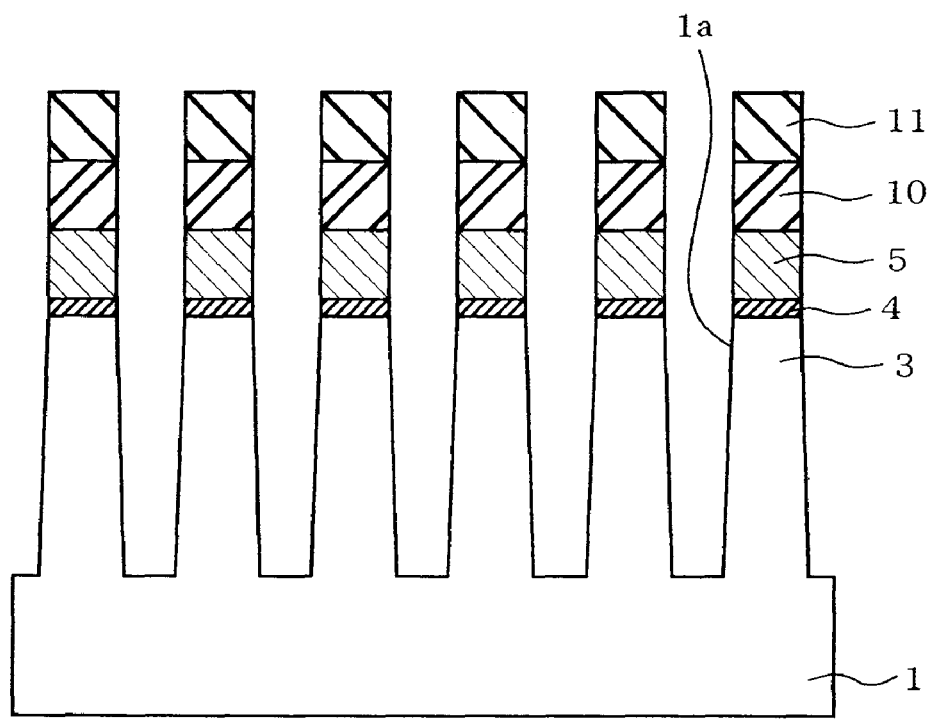

Next, a fabrication process which is a second objective in the embodiment is shown in FIGS. 3A and 3B, which are schematic sectional views showing unprocessed and processed states respectively in the case where an element isolation trench in the NAND flash memory is formed. The sections as shown in FIGS. 3A and 3B are taken along line 3A-3A in FIG. 1A. However, FIGS. 3A and 3B show the state before the word line WL is formed although FIG. 1A shows the state in which the word line WL has been formed. In the state prior to the process as shown in FIG. 3A, the gate insulating film 4 is formed on the silicon substrate 1. The polycrystalline silicon film 5 serving as a lower layer of the gate electrode MG is further formed on the upper surface of the gate insulating film 4. The silicon nitride film 10 is still further formed on an upper surface of the polycrystalline silicon film 5. The silicon oxide film 11 serving as the mask film is formed into a predetermined pattern. A shrunk pattern is formed on an upper surface of the silicon oxide film 11 in a fabrication step prior to the process as shown in FIGS. 3A and 3B. The silicon oxide film 11 is obtained by an etching process using the shrunk pattern. The silicon oxide film 11 serving as the mask film has a pattern width of about 15 nm and a spacing of about 15 nm that is a distance between adjacent patterns.

The silicon nitride film 10, the polycrystalline silicon film 5, the gate insulating film 4 and the silicon substrate 1 all of which constitute the base layer are etched by a reactive ion etching (RIE) process with the silicon oxide film 11 serving as a mask as shown in FIG. 3B, whereby a trench 1a having a predetermined depth is formed in the silicon substrate 1. The trench 1a is filled with a silicon oxide film or the like serving as an element isolation insulating film in a post-process. As a result, the trench 1a is formed into the aforesaid trench with the STI structure of the memory cell region.

Next, a step of forming the shrunk pattern as shown in FIG. 2A will be described with reference to FIGS. 4 to 11, which are views of the silicon nitride film 8 serving as the mask film and the polycrystalline silicon film 7 to be processed in the part as shown in FIGS. 2A and 2B. The intergate insulating film 6, the polycrystalline silicon film 5, the gate insulating film 4 and the silicon substrate 1 are eliminated in FIGS. 4 to 11. Plural equally spaced broken lines indicate the spacings of dimension Wa of a line and space to be finally formed. The dimension Wa corresponds to 15 nm, for example.

Figure 4:
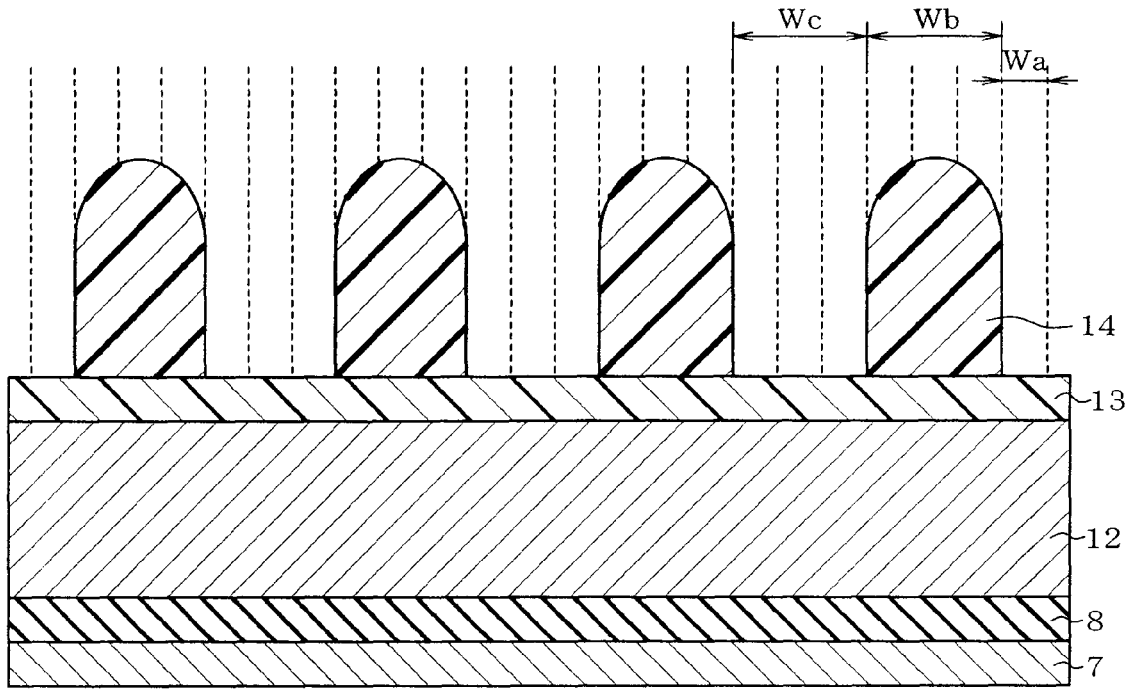

Firstly, as shown in FIG. 4, the silicon nitride film 8 serving as the mask film is formed on the polycrystalline silicon film 7 serving as the gate electrode. Furthermore, the amorphous silicon film 12 which is a first film to be formed into a core material pattern is formed by a chemical vapor deposition (CVD) method. Subsequently, a photolithography process is carried out so that an antireflective film 13 and photoresist 14 are applied, and a trench pattern is formed by a lithography technique and has a line dimension Wb of 45 nm and a space dimension Wc of 45 nm.

Figure 5:
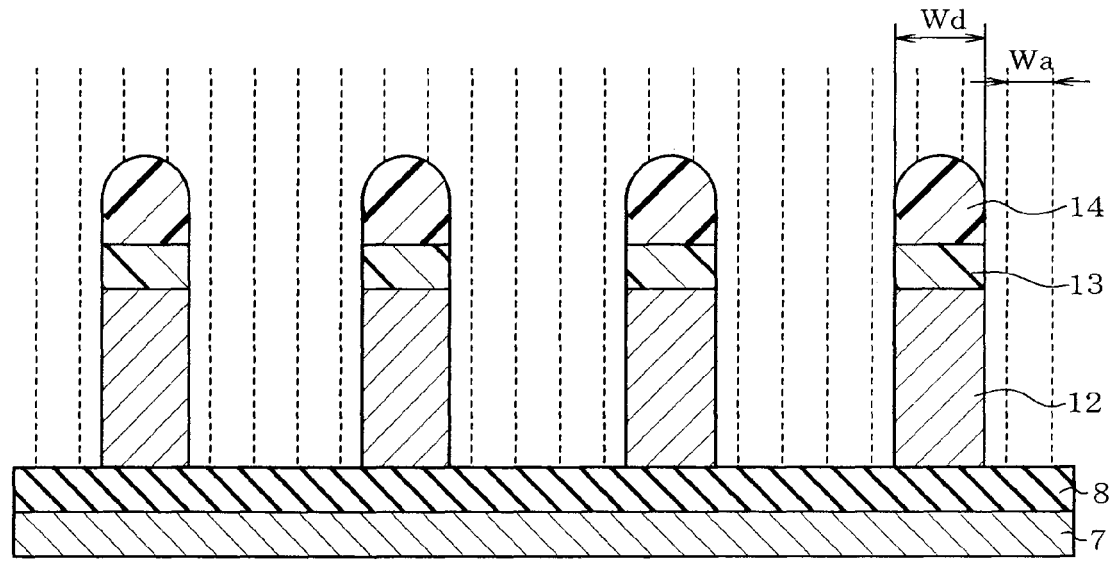

Subsequently, as shown in FIG. 5, the amorphous silicon film 12 is processed by the RIE method into a plurality of patterns separated from each other while the resist 14 forming the trench pattern serves as a mask, thereby being formed into the core material patterns. The amorphous silicon film formed into the core material patterns is further processed using a slimming technique so that a width or a line dimension Wd thereof becomes 30 nm (two thirds of Wb). The aforesaid RIE process employs a gas mainly composed of hydrogen bromide (HBr) and a condition under which such an etching selectivity that the silicon nitride film 8 serving as the base layer remains is obtained.

Figure 6:
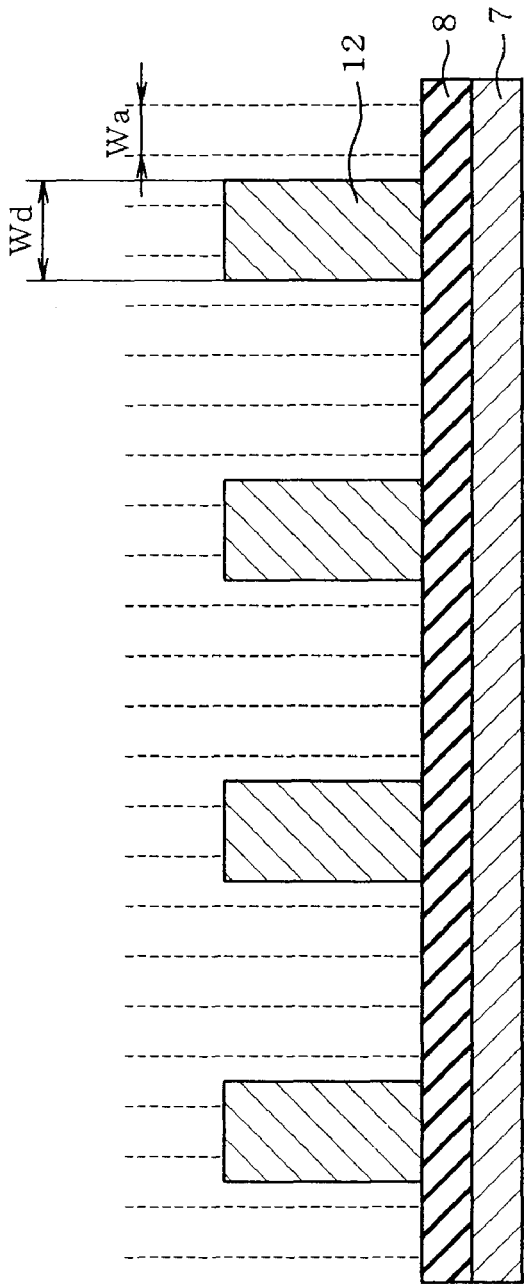
Figure 7:
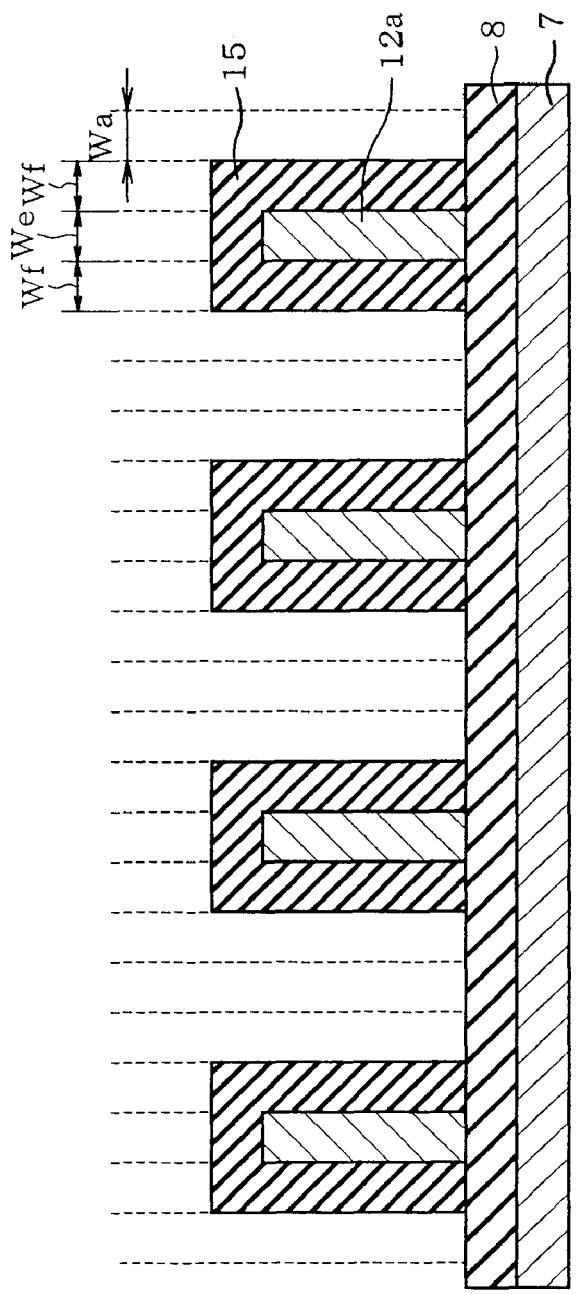

Subsequently, as shown in FIG. 6, the antireflective coating 13 and the resist film 14 are removed by an ashing process or the like. A wet cleaning process is then carried out to clean sidewalls and upper surfaces of the separated portions of the amorphous silicon film 12 so that impurities such as the resist film 14 can be prevented from remaining. Subsequently, as shown in FIG. 7, a thermal oxidation process is applied to a surface layer of each separated portion of the amorphous silicon film 12 for surface modification, whereby the surface layer of each separated portion of the film 12 is modified into an oxide layer 15 serving as a second film. As the result of the surface modification, the surface layer of each portion of the amorphous silicon film 12 is oxidized such that the dimension We is reduced to 15 nm, and each oxide layer 15 having a film thickness Wf is formed on the sidewalls and upper surface of each separated portion of the amorphous silicon film 12. The film thickness Wf is larger than an amount of reduction in the dimension We of each separated portion of the amorphous silicon film 12. In this case, the oxide layer 15 is formed so that a film thickness thereof becomes 15 nm. At the same time, a dimension We of the core material formed from the amorphous silicon film 12a also becomes about 15 nm. Thus, both dimensions We and Wf are caused to equal to the dimension Wa of the line and space.

Figure 8:
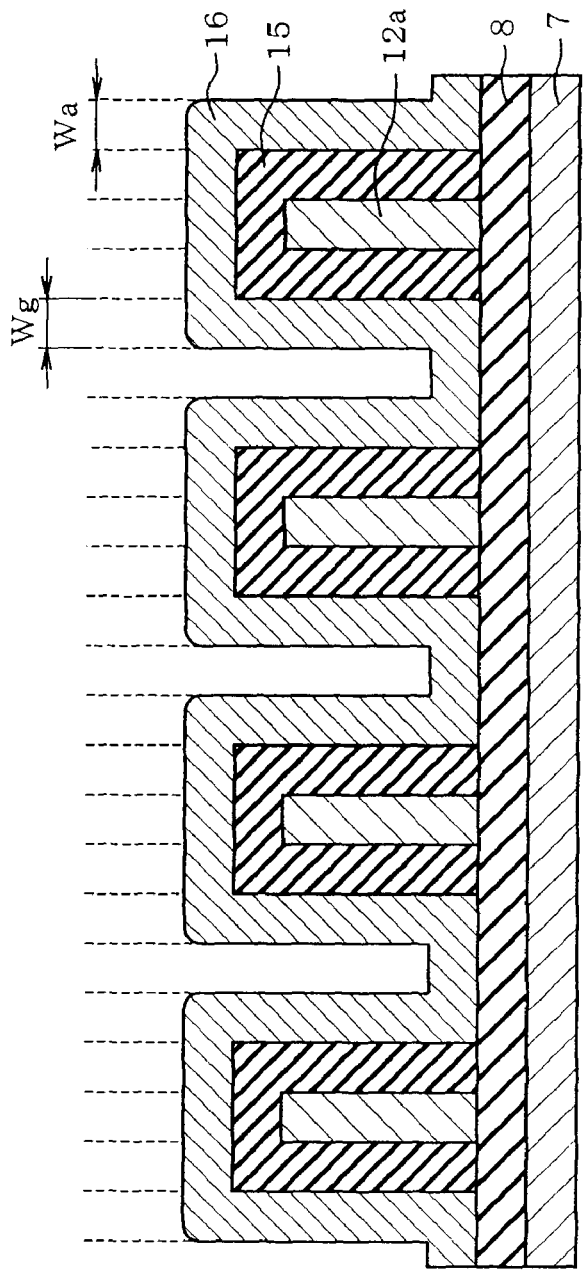
Figure 9:
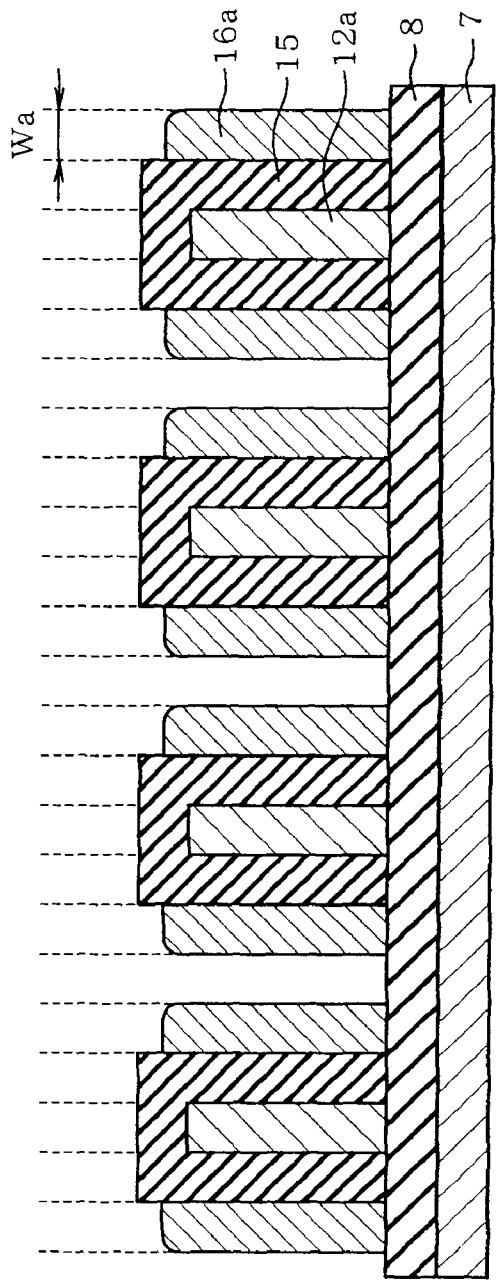

Subsequently, as shown in FIG. 8, an amorphous silicon film 16 serving as a third film is formed so as to cover all the separated portions of the oxide layer 15. The amorphous silicon film 16 has a film thickness Wg of 15 nm, which value is equal to the dimension Wa of the line and space. As a result, the amorphous silicon film 16 is formed over the upper surfaces and sidewalls of the oxide layer 15 serving as the second film and the upper surface of the silicon nitride film 8. Subsequently, as shown in FIG. 9, the amorphous silicon film 16 is etched back by the RIE method so as to be spacer-shaped. As a result, portions of the film 16 formed on the upper surfaces of the oxide layer 15 are removed. Portions of the film 16 formed on the upper surfaces of the silicon nitride film 8 are also removed. The amorphous silicon film 16a serving as sidewalls is caused to selectively remain with the oxide layer 15 being interposed between the amorphous silicon film 12a serving as the core material and the film 16a. The aforesaid RIE process employs a gas mainly composed of hydrogen bromide (HBr).

Subsequently, as shown in FIG. 10, the oxide layer 15 is completely removed by execution of a wet cleaning process such as hydrofluoric acid (HF) treatment. As a result, the oxide film layer 15 is selectively removed with the amorphous silicon films 12a and 16a remaining. The amorphous silicon films 12a and 16a are then formed into shrunk patterns 9a and 9b respectively. The shrunk patterns 9a and 9b constitute a shrunk pattern 9. The line and space pattern formed from the shrunk pattern 9 comprising the amorphous silicon films has dimensions We and Wg and an interval between the shrunk patterns 9a and 9b each of which becomes 15 nm (=Wa). Thus, the dimensions We and Wg can also be rendered equal to one third of the dimensions Wb and Wc.

A pattern as shown in FIG. 11 is obtained when the silicon nitride film 8 serving as a base material is processed by the RIE method using the obtained shrunk pattern 9 as a mask. The pattern of the silicon nitride film 8 has the width of 15 nm and the spacing of the dimension Wa of 15 nm. Consequently, a microscopic pattern shrunk to about one third can be obtained and cannot be obtained by an ordinary lithography process.

In the foregoing embodiment, the process is applied to the first objective as shown in FIGS. 2A and 2B where an object to be processed is the silicon nitride film 8. However, the process may be applied to the second objective as shown in FIGS. 3A and 3B, instead. Since the object to be processed is a silicon oxide film 11 in this case as shown in FIGS. 3A and 3B, the oxide film and the nitride film in the above-described embodiment are replaced by each other. More specifically, the same amorphous silicon films 12 and 16 serving as the first and third films respectively are used in the modified form. A nitride film layer is formed instead of the oxide layer 15 serving as the second film. As a result, the similar processing can be executed. The nitride film layer serving as the second film can be formed as a silicon nitride film when a nitriding process is carried out to modify the surface of the amorphous silicon film 12.

FIGS. 12A to 21B show a second embodiment of the invention. The second embodiment differs from the first embodiment in that the line and space pattern has different pattern widths and spacings. For example, in NAND flash memories, the selective gate electrodes SG and a gate electrode PG of the transistor in the peripheral circuit region have respective patterns with pitches differing from those of the other patterns. Accordingly, informing gates, these portions necessitate separate processing. FIGS. 12A, 13A and so on are sectional views taken along line 12A-12A in FIG. 1A. FIGS. 12B, 13B and so on are sectional views taken along line 12B-12B in FIG. 1A.

The following describes a fabricating process in the case where the NAND flash memory has the selective gate electrodes SG and the gate electrodes PG of the peripheral circuit regions. Firstly, as shown in FIGS. 12A and 12B, the silicon nitride film 8 serving as the mask film is formed on the polycrystalline silicon film (not shown) to be formed into the gate electrodes in the same manner as in the first embodiment, as shown in FIGS. 12A and 12B. Furthermore, the amorphous silicon film 12 serving as the first film for forming the core material pattern is formed by the CVD method. Subsequently, the antireflective coating 13 and the photoresist 14 are applied to the amorphous silicon film 12 in turn to be formed into the resist pattern by the photolithography process. In this case, the resist pattern is a trench pattern in which the portion of the word line WL corresponding to the gate electrode MG has a line dimension Wb of 45 nm and a spacing dimension Wc of 45 nm. The portion of the selective gate line SGL corresponding to the selective gate electrode SG has a line dimension Wh of 75 nm and a spacing dimension (not shown) of 75 nm. Furthermore, an isolation pattern corresponding to an isolated gate electrode PG is also provided with the resist pattern and has the line dimension Wi of 105 nm and a space dimension (not shown) of 2000 nm.

Figures 13A, 13B:
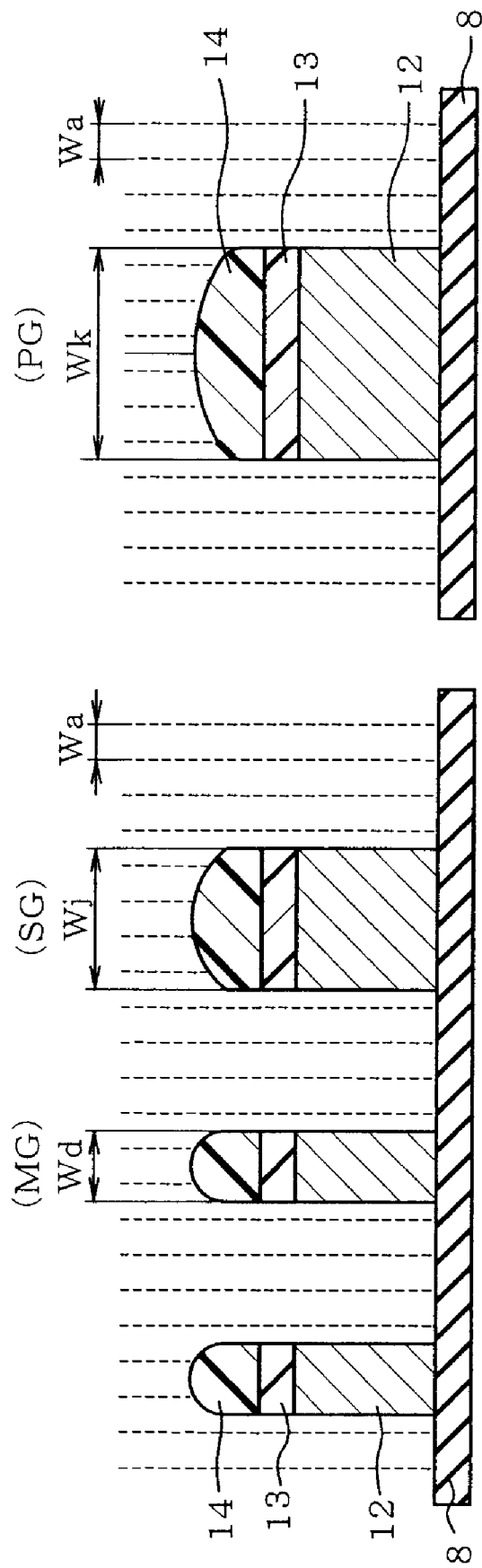

Subsequently, as shown in FIGS. 13A and 13B, the amorphous silicon film 12 is processed by the RIE method into a plurality of patterns separated from each other while the resist 14 forming the trench pattern serves as the mask, thereby being formed into the core material patterns. The amorphous silicon film 12 includes core material patterns corresponding to the gate electrodes MG and having a first width Wb and core material patterns corresponding to the selective gate electrodes SG and having a second width Wh. The amorphous silicon film 12 formed as the core material patterns for the gate electrodes MG of the memory cell transistors is processed by the slimming technique so as to have a width or line dimension Wd of 30 nm (two thirds of Wb). In this case, the aforesaid RIE process employs a gas mainly composed of hydrogen bromide (HBr) and a condition under which such an etching selectivity that the base layer remains is obtained. In the aforesaid slimming process, the selective gate electrodes SG and the isolated gate electrodes PG are also processed as well as the gate electrodes MG. As a result, each selective gate electrode SG has a line dimension Wj of 60 nm and each isolated gate electrode PG has a line dimension Wk of 90 nm.

Figures 15A, 15B:
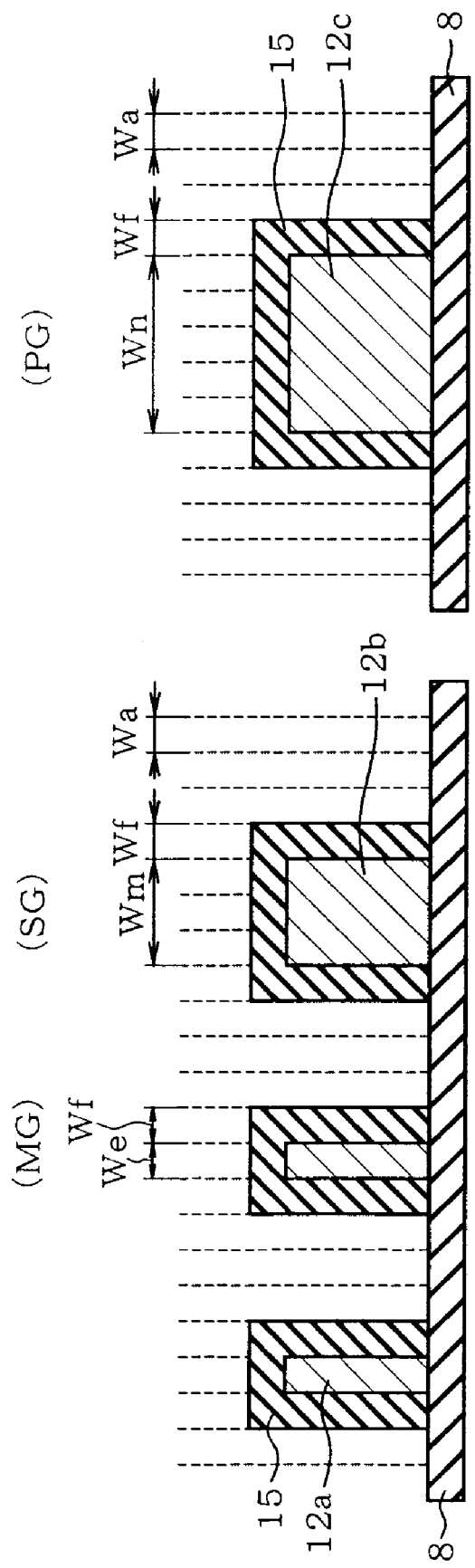

Subsequently, as shown in FIGS. 14A and 14B, the antireflective film 13 and the resist film 14 are removed by the ashing process, and the wet cleaning process is then carried out to clean the sidewalls of the amorphous silicon film 12 so that impurities such as the resist film 14 can be prevented from remaining. Subsequently, as shown in FIGS. 15A and 15B, a thermal oxidation process is applied to a surface layer of each separated portion of the amorphous silicon film 12 for surface modification, whereby the surface layer of each separated portion of the film 12 is modified into an oxide layer 15 serving as a second film such that the separated portions of the film 12 are formed into the amorphous silicon films 12a, 12b and 12c. As the result of the surface modification, the surface layer of each portion of the amorphous silicon film 12 is oxidized such that the dimensions of the amorphous silicon films 12a, 12b and 12c are reduced. In this case, the oxide layer 15 is formed so as to have a film thickness of 15 nm. At the same time, the dimensions We, Wm and Wn of the amorphous silicon films 12a, 12b and 12c are about 15 nm, 45 nm and 75 nm respectively.

Figures 16A, 16B:
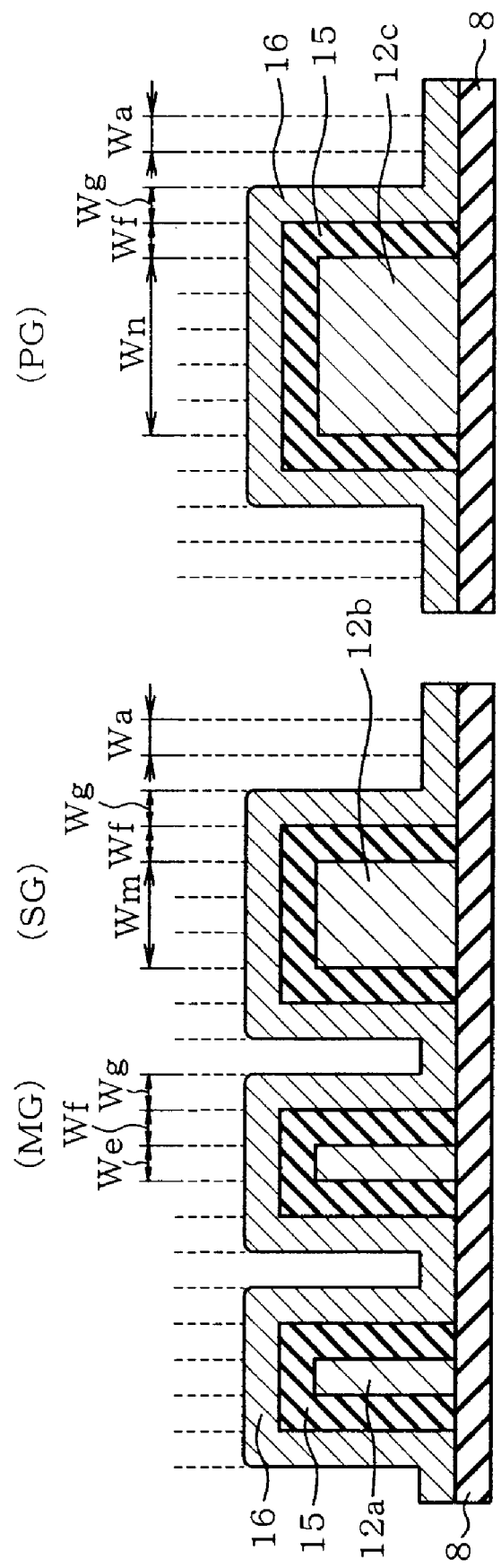
Figures 17A, 17B:
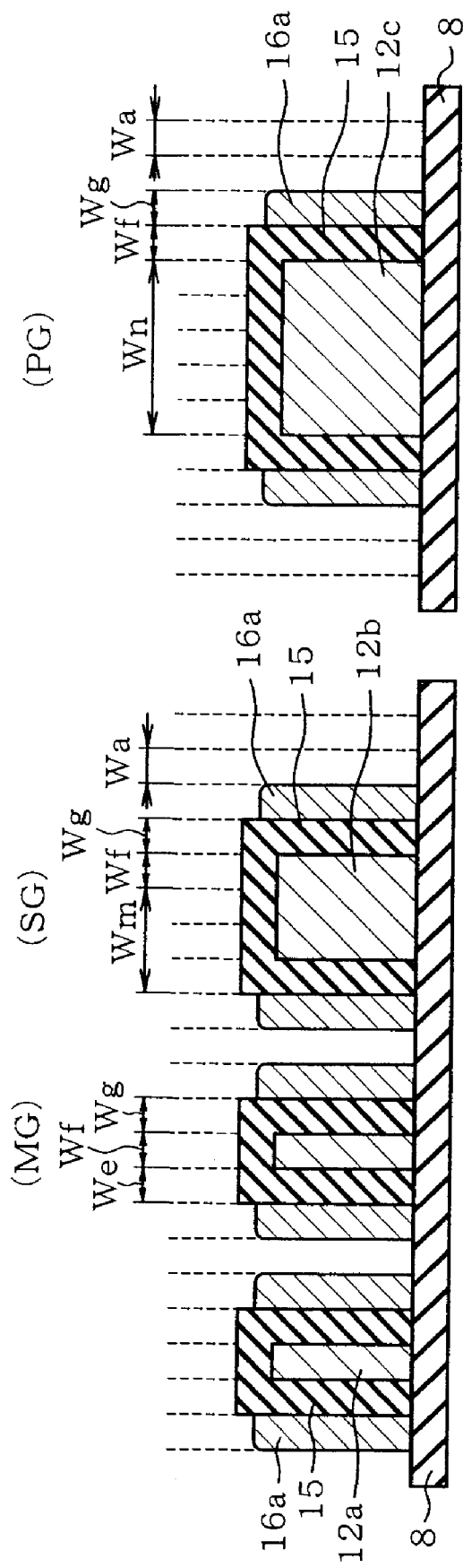

Subsequently, as shown in FIGS. 16A and 16B, the amorphous silicon film 16 serving as a third film is formed so as to cover all the separated portions of the oxide layer 15 and the surface of the silicon nitride film 8. The amorphous silicon film 16 has a film thickness Wg of 15 nm, which value is equal to the dimension Wa of the line and space. As a result, the amorphous silicon film 16 is formed over sidewalls of the oxide layer 15 covering the amorphous silicon films 12a, 12b and 12c serving as the core materials. Subsequently, as shown in FIGS. 17A and 17B, the amorphous silicon film 16 is etched back by the RIE method so as to be spacer-shaped. As a result, portions of the film 16 formed on the upper surfaces of the oxide layer 15 are removed. Portions of the film 16 formed on the upper surfaces of the silicon nitride film 8 are also removed. The amorphous silicon film 16a serving as sidewalls is caused to selectively remain with the oxide layer 15 being interposed between the amorphous silicon film 12a serving as the core material and the film 16a. The aforesaid RIE process employs a gas mainly composed of hydrogen bromide (HBr).

Figures 18A, 18B:
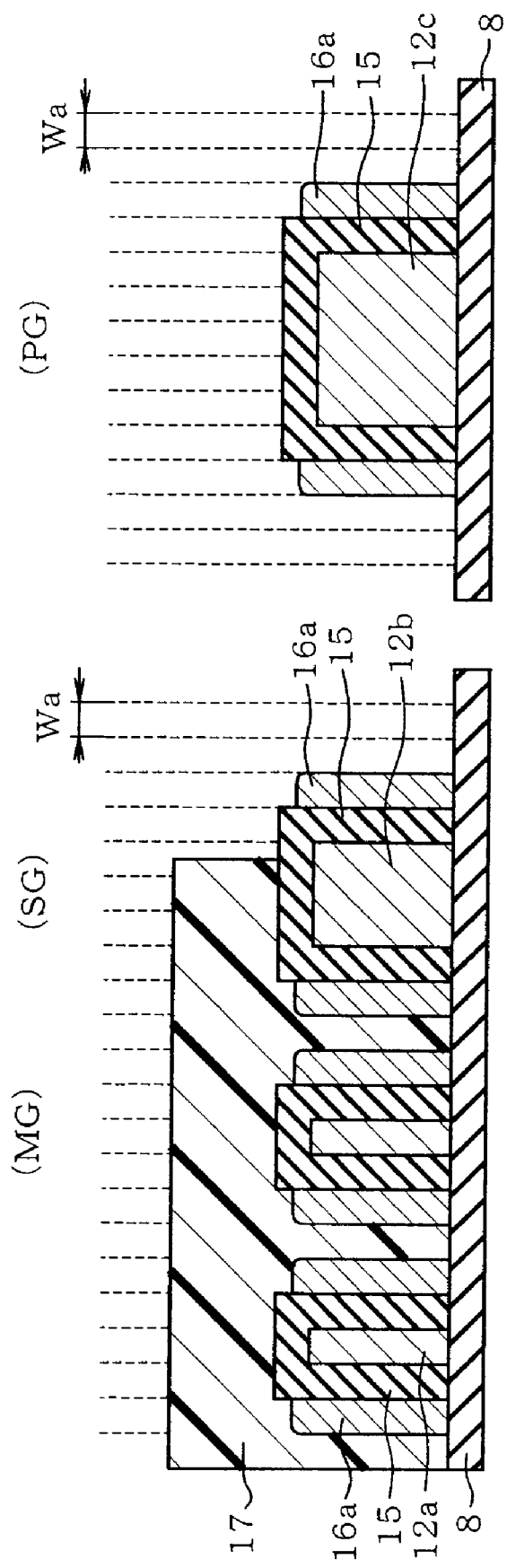

Subsequently, the amorphous silicon film 16a includes portions formed on the opposed sidewalls of the adjacent selective gate electrodes SG and portions formed on both sidewalls of each isolated gate electrode PG. These portions of the film 16a are removed since these portions are unnecessary in the processing. In removing these portions, as shown in FIGS. 18A and 18B, the photoresist 17 is applied and patterned by the photolithographic process into a pattern differing from the resist used as the mask during the forming of the core material patterns. As a result, the photoresist 17 covers portions of the word lines WL corresponding to the gate electrodes MG and a portion of the selective gate electrode SG located at the gate electrode MG side, whereas the photoresist 17 maintains in an open state the region of the electrode SG located opposite the line and space pattern of the gate electrodes MG or opposed to the adjacent selective gate electrode SG and the isolated gate electrode PG.

Furthermore, the photoresist 17 may be patterned so as to expose portions of the films 16a formed on both lengthwise ends of the sidewalls of the oxide film layers 15 formed on the amorphous silicon films 12a, 12b and 12c respectively, as viewed in FIG. 1A. In this case, the amorphous silicon films 16a formed on both exposed ends of the layer 15 in each gate electrode MG may be separated in the selective removal of the amorphous silicon films 16a described below.

Figures 19A, 19B:
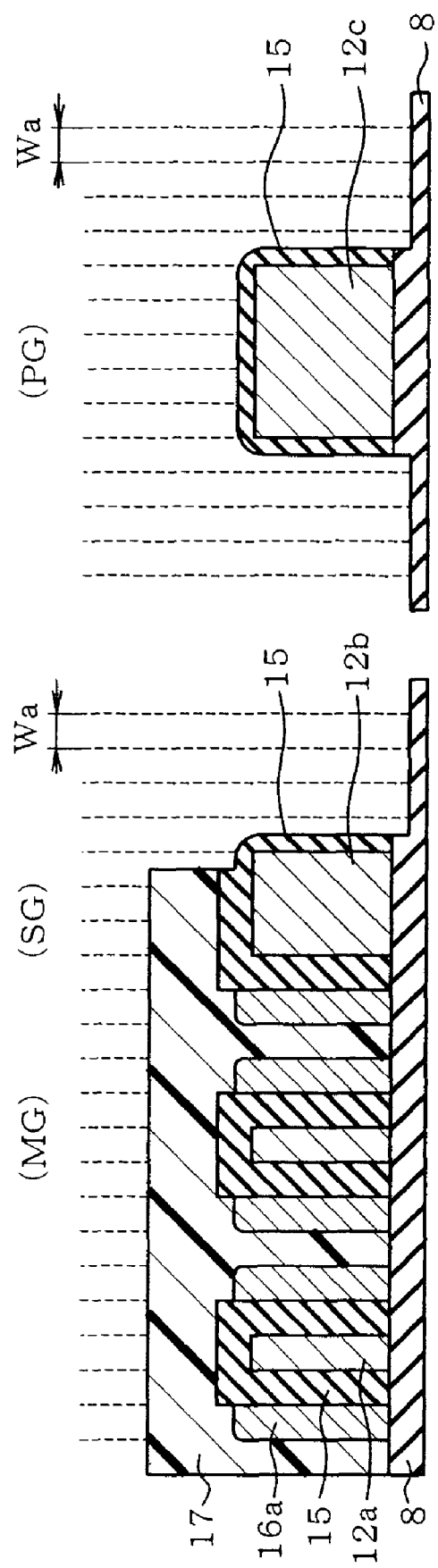

Subsequently, as shown in FIGS. 19A and 19B, a chemical dry etching (CDE) process with the use of a $CF_4/O_2$ gas is carried out to remove a part of the amorphous silicon film 16a exposed in an opening of the photoresist 17. This isotropic etching process employs the condition that the amorphous silicon is selectively etched with the silicon oxide film and the silicon nitride film remaining. This process removes the amorphous silicon film 16a remaining on the sidewall of the layer 15 of the electrode SG located on the adjacent electrode SG side and the amorphous silicon films 16a formed on both sidewalls of the layer 15 of the isolated gate electrode PG. In this case, exposed portions of the layer 15 and the silicon nitride film 8 are sometimes etched thereby to be rendered thinner for the reason that a large selectivity cannot actually be obtained or for another reason.

Figures 20A, 20B:
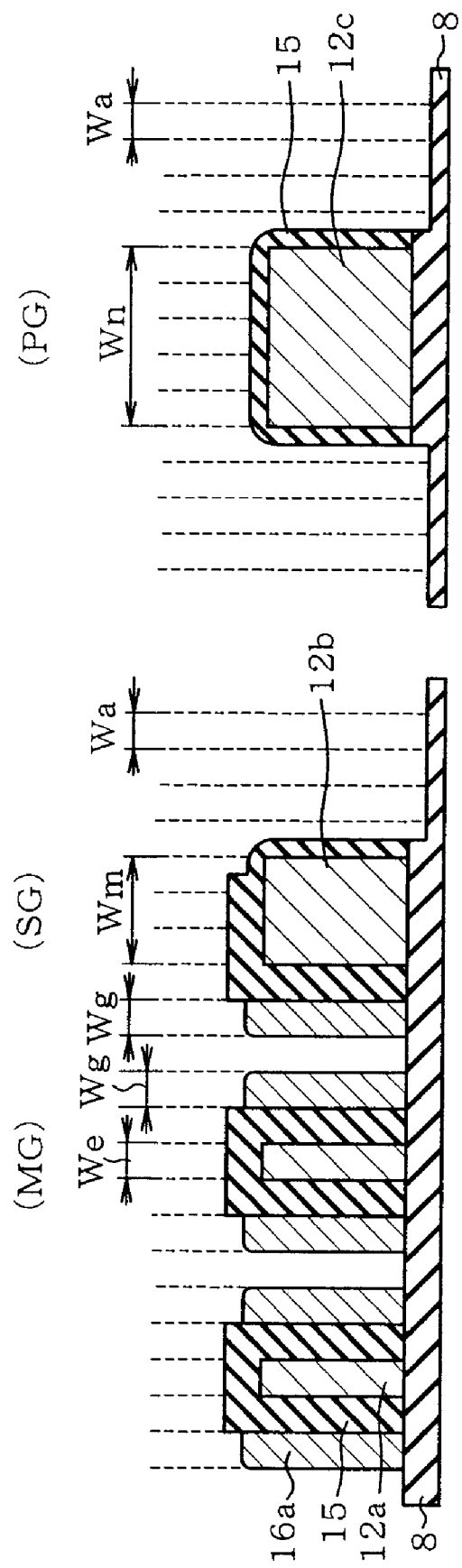

Subsequently, as shown in FIGS. 20A and 20B, the photoresist 17 is removed by an ashing process. A wet cleaning process with use of hydrofluoric acid (HF) is carried out to remove the oxide film layer 15 completely as shown in FIGS. 21A and 21B. As a result, each amorphous silicon film 12a is formed as a shrunk pattern 9a, and each amorphous silicon film 16a is formed as a shrunk pattern 9b. These shrunk patterns 9a and 9b constitute a shrunk pattern 9. The line and space pattern comprising the shrunk pattern 9 formed from the amorphous silicon film has dimensions We and Wg and an interval Wf between the patterns 9a and 9b all of which are set at 15 nm and accordingly are one third of the dimensions Wb and Wc of the initial line and space pattern. Furthermore, the pattern obtained by the amorphous silicon film 12b of each selective gate electrode SG has a pattern dimension Wm of 45 nm. The pattern obtained from the amorphous silicon film 12c of the isolated gate electrode PG has a pattern dimension Wn of 75 nm.

The silicon nitride film 8 serving as the base layer is processed by the RIE method using as the masks the shrunk pattern 9 obtained through the above-described processes and patterns 12b and 12c. As a result, the silicon nitride film 8 can be patterned using a desired line and space with the dimension Wa regarding the gate electrode MG corresponding to each word line WL in the same manner as shown in FIG. 11 even in the process of simultaneously forming the selective gate electrodes SG and the isolated gate electrodes MG.

In the foregoing embodiment, the process is applied to the first objective as shown in FIGS. 2A and 2B where an object to be processed is the silicon nitride film 8. However, the process may be applied to the second objective as shown in FIGS. 3A and 3B, instead. Since an object to be processed is a silicon oxide film 11 in this case as shown in FIGS. 3A and 3B, the oxide film and the nitride film in the above-described embodiment are replaced by each other.

FIGS. 22A to 25B illustrate a third embodiment of the invention. The third embodiment differs from the second embodiment in the following respect. In the second embodiment, the photolithography process as shown in FIGS. 17A and 17B is carried out to remove the amorphous silicon films 16a formed on the sidewalls of the selective gate electrodes SG located opposite each other and the amorphous silicon films 16a formed on the sidewalls of the isolated gate electrode PG. In the third embodiment, however, the same pattern is formed without execution of the photolithography process.

Figures 22A, 22B:
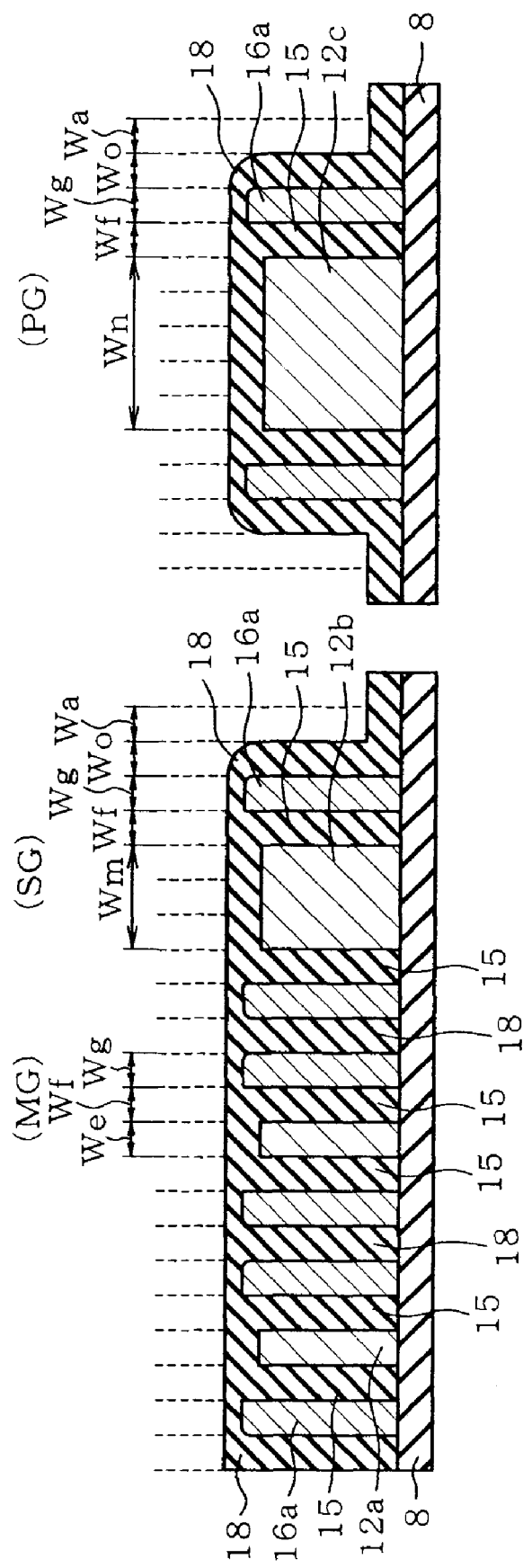
FIGS. 22A and 22B are sectional views showing the mask pattern forming step in a method of a third embodiment, the views being taken along line 12A-12A in FIG. 1A and line 12B-12B in FIG. 1B respectively (NO.1)

The processing starting at the state as shown in FIGS. 17A and 17B will be described. A silicon oxide film 18 serving as a fourth film is formed so as to cover all the amorphous silicon films 16a in the state as shown in FIGS. 17A and 17B, as shown in FIGS. 22A and 22B. In this case, a film thickness of the silicon oxide film 18 is adjusted so that a space between the gate electrodes MG corresponding to the respective word lines WL is completely filled by the silicon oxide film 18 up to upper surfaces of the amorphous silicon films 12a and 16a.

On the other hand, the region where the selective gate electrodes SG are opposed to each other is incompletely filled with the silicon oxide film 18 such that a trench is formed between the adjacent selective gate electrodes SG. The regions located at both sides of the amorphous silicon film 12c of the isolated gate electrode PG are also incompletely filled with the silicon oxide film 18, whereupon trenches are formed at both sides of the isolated gate electrode PG. In the embodiment, since the silicon oxide film 18 has a film thickness Wo of 15 nm, the region between the gate electrodes MG constituting the respective word lines WL is completely filled with the silicon oxide film 18, whereas the film thickness of the silicon oxide film 18 is maintained along the side of the selective gate electrode SG and both sides of the isolated gate electrode PG.

Figures 23A, 23B:
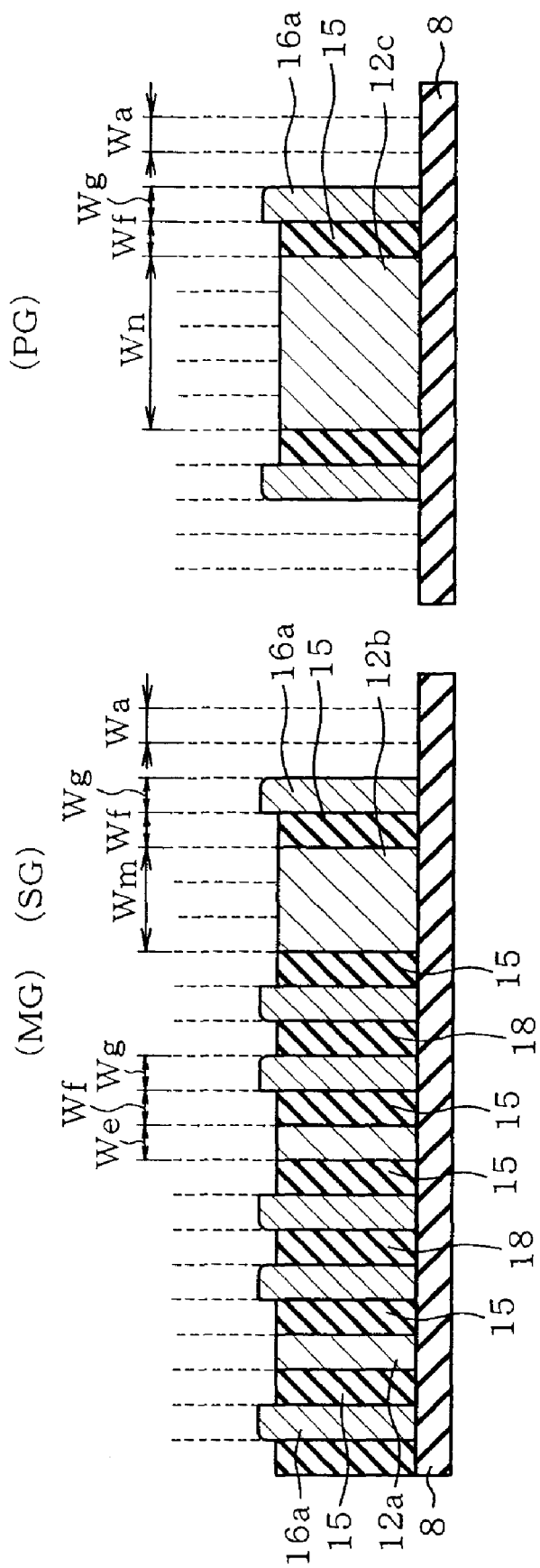

Subsequently, as shown in FIGS. 23A and 23B, the silicon oxide film 18 is isotropically etched by a CDE process with use of the $CF_4/O_2$ gas or a wet cleaning process such as the hydrofluoric acid (HF) treatment. As a result, the silicon oxide film 18 is retreated until the sides of the amorphous silicon films 16a are exposed in the region where the selective gate electrodes SG are opposed to each other and in the regions located at both sides of the isolated gate electrode PG.

Subsequently, as shown in FIGS. 24A and 24B, a thermal oxidation process is carried out to modify the surfaces of the exposed amorphous silicon films 16a. The exposed sides of the amorphous silicon films 16a are modified into silicon oxide films 15a serving as a fifth film. The upper surfaces of the other amorphous silicon films 16a are selectively modified into silicon oxide films 15a. Furthermore, the upper surfaces of the amorphous silicon films 12a to 12c serving as the core materials are also modified into silicon oxide films 15 when the oxide film layer 15 is etched in the isotropic etching of the silicon oxide film 18 until the amorphous silicon films 12a to 12c serving as the core materials are exposed, as shown in FIGS. 23A and 23B. Consequently, the silicon oxide films 15 and 18 formed between the gate electrodes MG and between the selective gate electrodes SG are re-designated as the silicon oxide films 15a, covering the amorphous silicon films 12a to 12c, as shown in FIGS. 24A and 24B.

Figures 25A, 25B:
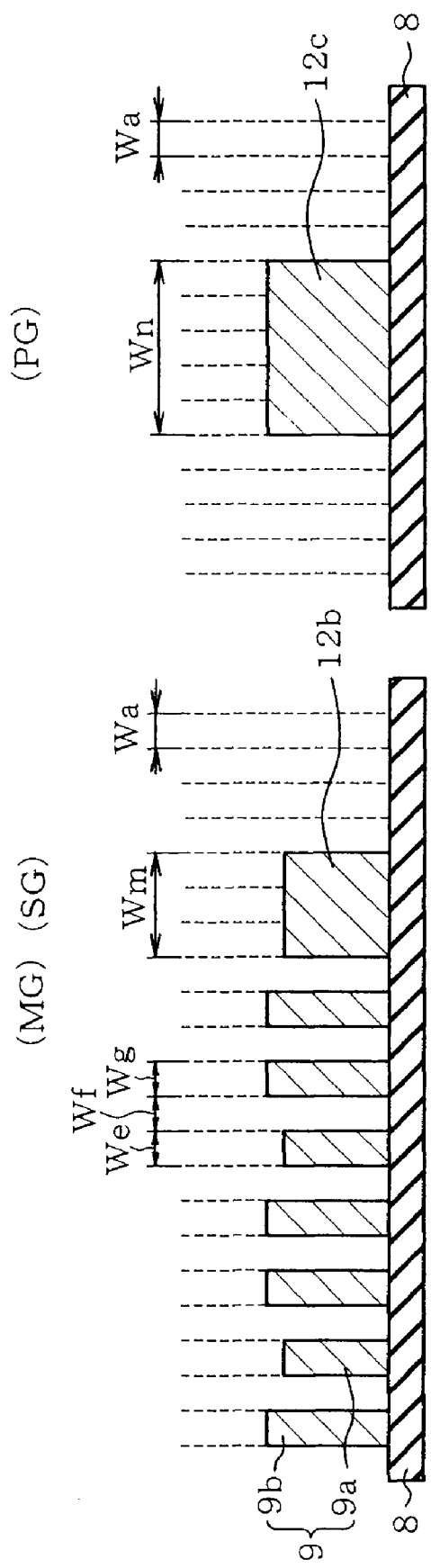

Subsequently, as shown in FIGS. 25A and 25B, the wet cleaning process with use of hydrofluoric acid (HF) is carried out to remove the silicon oxide films 15a, whereupon the amorphous silicon films 12a and 16a are formed into the shrunk patterns 9a and 9b respectively. The shrunk pattern 9 is thus constituted by the shrunk patterns 9a and 9b. In this case, the amorphous silicon films 16a formed on both lengthwise ends are modified into the oxide film layer 15a and removed by the wet cleaning process, whereupon the shrunk patterns 9b located at both ends of the shrunk pattern 9a can be separated.

The line and space pattern comprising the shrunk pattern 9 formed from the amorphous silicon film has dimensions We and Wg and an interval Wf between the patterns 9a and 9b all of which are set at 15 nm and accordingly are each one third of the dimensions Wb and Wc of the initial line and space pattern. Furthermore, the pattern obtained by the amorphous silicon film 12b of each selective gate electrode SG has a pattern dimension Wm of 45 nm. The pattern obtained from the amorphous silicon film 12c of the isolated gate electrode PG has a pattern dimension Wn of 75 nm.

The silicon nitride film 8 serving as the base layer is processed by the RIE method using as the masks the shrunk pattern 9 obtained through the above-described processes and patterns 12b and 12c. As a result, the silicon nitride film 8 can be patterned using a desired line and space with the dimension Wa regarding the gate electrode MG corresponding to each word line WL in the same manner as shown in FIG. 11 even in the process of simultaneously forming the selective gate electrodes SG and the isolated gate electrodes MG.

In the foregoing embodiment, the process is applied to the first objective as shown in FIGS. 2A and 2B where an object to be processed is the silicon nitride film 8. However, the process may be applied to the second objective as shown in FIGS. 3A and 3B, instead. Since an object to be processed is a silicon oxide film 11 in this case as shown in FIGS. 3A and 3B, the oxide film and the nitride film in the above-described embodiment are replaced by each other.

The invention should not be limited to the foregoing embodiments. The embodiments may be modified or expanded as follows. The base layer of the shrunk pattern should not be limited to the silicon nitride film or the silicon oxide film. Any film may be used that can provide selectivity with respect to the other film when serving as a mask film, instead. Furthermore, the object to which a one-third pattern is to be transferred may be an insulating film, another conductive film or semiconductor film other than the polycrystalline silicon film and the silicon substrate. Additionally, the device to be fabricated by the method of the invention should not be limited to the NAND flash memory. The device may be a NOR flash memory, an SRAM or any other semiconductor device. Furthermore, the invention may be applied to overall semiconductor devices in which a line and space pattern is formed.

The foregoing description and drawings are merely illustrative and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising steps of:
    a first step of forming a plurality of core material patterns which are separated from each other above a substrate and comprise a first film;
    a second step of modifying surfaces of the core material patterns to form a second film which is selectively etchable with the first film internally remaining and which includes portions separated from each other above the substrate, the second film not covering a base layer of the core material patterns between the core material patterns;
    a subsequent step of forming a third film to cover upper surfaces and side surfaces of the portions of the second film and an upper surface of the substrate;
    a third step of etching back the third film to expose the upper surfaces of the portions of the second film and to expose the base layer of the core material patterns between the core material patterns, and causing the third film to selectively remain, the third film being formed on sidewalls of the core material patterns with the second film being interposed there between;
    a fourth step of selectively removing the second film with the first and third films remaining; and
    a fifth step of patterning the base layer with the first and third films both on the base layer serving as a mask after the second film has been removed, thereby forming a base layer pattern.

2. The method according to claim 1, wherein the core material patterns are formed so that each core material pattern has a width that is substantially equal to an interval between said each core material pattern and the adjacent core material pattern, and the base layer pattern is transferred to a conductive film, whereby a plurality of gate electrodes arranged with a pitch are formed, said pitch of the gate electrodes being substantially equal to one third of that of the core material patterns.

3. The method according to claim 1, wherein the core material patterns are formed so that a width of each core material pattern is substantially equal to an interval between said each core material pattern and the adjacent core material pattern, and the base layer pattern is transferred to a semiconductor substrate, whereby a plurality of trenches arranged with a pitch are formed, said pitch of the trenches being substantially equal to one third of that of the core material patterns.

4. The method according to claim 1, wherein each of the first and third films is a silicon film, and the base layer and the second film are one of a silicon nitride film and a silicon oxide film and the other of the silicon nitride film and the silicon oxide film respectively.

5. The method according to claim 1, wherein in forming the second film, the surface of each core material pattern is modified after execution of a slimming process for each core material pattern so that a width of each core material pattern and a film thickness of the second film are substantially equal to each other when the forming of the second film has been completed.

6. The method according to claim 1, wherein a semiconductor substrate serving as the substrate and at least a part of a gate electrode film formed above the substrate are processed with the base layer pattern serving as a mask, whereby an element isolation trench is formed.

7. The method according to claim 1, wherein a stacked structure of a gate electrode film formed above a semiconductor substrate serving as the substrate is processed with the base layer pattern serving as a mask, whereby a gate electrode is formed.

8. A method of fabricating a semiconductor device, comprising:
   forming a plurality of core material patterns which are separated from each other above a substrate and comprise a first film;
   modifying surfaces of the core material patterns to form a second film which is selectively etchable with the first film internally remaining;
   forming a third film to cover an upper surface and side surfaces of the second film and an upper surface of the substrate;
   etching back the third film to expose the upper surface of the second film and to expose a base layer of the core material patterns between the core material patterns, and causing the third film to selectively remain, the third film being formed on sidewalls of the core material patterns with the second film being interposed therebetween;
   forming a resist film with a pattern differing from the core material patterns above the substrate after the third film has been etched back, and selectively removing a part of the third film with said pattern of the resist film serving as a mask while the second film remains;
   selectively removing the second film with the first and third films remaining after the resist film has been removed; and
   patterning the base layer with the first and third films remaining on the base layer serving as a mask after the second film has been removed, thereby forming a base layer pattern.

9. The method according to claim 8, wherein the core material patterns are formed so as to have at least a line and space pattern, and the base layer pattern originating from the line and space pattern is transferred to a conductive film so that a plurality of gate electrodes arranged with a pitch that is substantially equal to one third of that of the core material patterns are formed.

10. The method according to claim 8, wherein each of the first and third films is a silicon film, and the base layer and the second film are one of a silicon nitride film and a silicon oxide film and the other of the silicon nitride film and the silicon oxide film respectively.

11. The method according to claim 8, wherein in forming the core material patterns, a core material pattern with a first width is provided for forming a line and space, a core material pattern with a second width larger than the first width is formed so as to be adjacent to the line and space, in forming the resist film, the resist film is formed so as to cover the core material pattern with the first width and a line and base side part of the core material pattern with the second width respectively, and in selectively removing the part of the third film, the third film formed on a sidewall located opposite the line and space of the core material pattern with the second width is selectively removed.

12. The method according to claim 11, wherein the core material pattern with the first width is formed so as to correspond to a gate electrode of a memory cell transistor, and the core material pattern with the second width is formed so as to correspond to a gate electrode of a selective gate transistor.

13. The method according to claim 8, wherein in forming the core material patterns, a first core material pattern used to form a line and space and a second core material pattern used to form an isolation pattern are formed, and in forming the resist film, the resist film is formed so that the first core material pattern is covered with the resist film and so that the second core material pattern is exposed, and in selectively removing the part of the third film, the third film formed on sidewalls of the second core material pattern is selectively removed.

14. The method according to claim 13, wherein the first core material pattern is formed so as to correspond to a gate electrode of a memory cell transistor, and the second core material pattern is formed so as to correspond to a gate electrode of a peripheral circuit transistor.

15. A method of fabricating a semiconductor device, comprising:
   forming a plurality of core material patterns which are separated from each other above a substrate and comprise a first film;
   modifying surfaces of the core material patterns to form a second film which is selectively etchable with the first film internally remaining;
   forming a third film to cover an upper surface and side surfaces of the second film and an upper surface of the substrate;
   etching back the third film to expose the upper surface of the second film and to expose a base layer of the core material patterns between the core material patterns, and causing the third film to selectively remain, the third film being formed on sidewalls of the core material patterns with the second film being interposed therebetween;
   forming a fourth film to fill spaces between the core material patterns from which the base layer is exposed with the fourth film and to cover the third film with the fourth film, after the third film has been etched back;
   removing, by an isotropic etching process, a part of the fourth film other than parts of the fourth film filling the spaces between the core material patterns;

modifying a surface of at least the third film exposed by removal of the fourth film to form a fifth film which is selectively etchable with the first film remaining;

selectively removing the second, fourth and fifth films with the first and third films remaining; and patterning the base layer while the first and third films remaining on the base layer serve as a mask, after the second, fourth and fifth films have been removed, thereby forming a base layer pattern.

16. The method according to claim 15, wherein in forming the fifth film, an entire part of the third film having an exposed side is modified into the fifth film.

17. The method according to claim 15, wherein the core material patterns are formed so as to have at least a line and space pattern, and the base layer pattern originating from the line and space pattern is transferred to a conductive film so that a plurality of gate electrodes arranged with a pitch that is substantially equal to one third of that of the core material patterns are formed.

18. The method according to claim 15, wherein each of the first and third films is a silicon film, and the base layer and the second film are one of a silicon nitride film and a silicon oxide film and the other of the silicon nitride film and the silicon oxide film respectively.

19. The method according to claim 15, wherein in forming the core material patterns, a core material pattern with a first width is provided for forming a line and space, a core material pattern with a second width larger than the first width is formed so as to be adjacent to the line and space, and in removing the part of the fourth film, at least the fourth film covering the third film formed on a sidewall located opposite the line and space of the core material pattern with the second width is removed.

20. The method according to claim 15, wherein in forming the core material patterns, a first core material pattern used to form a line and space and a second core material pattern used to form an isolation pattern are formed, and in removing the part of the fourth film, at least the fourth film covering the third film formed on sidewalls of the core material pattern used to form the isolation pattern.

* * * * *